US010195714B2

(12) United States Patent
Itoyama et al.

(10) Patent No.: US 10,195,714 B2
(45) Date of Patent: Feb. 5, 2019

(54) POLISHING PAD AND PROCESS FOR PRODUCING SAME

(71) Applicant: FUJIBO HOLDINGS, INC., Chuo-ku, Tokyo (JP)

(72) Inventors: Kouki Itoyama, Tokyo (JP); Daisuke Takahashi, Saijo (JP)

(73) Assignee: FUJIBO HOLDINGS, INC., Chuo-Ku, Tokyo (JP)

( * ) Notice: Subject to any disclaimer, the term of this patent is extended or adjusted under 35 U.S.C. 154(b) by 30 days.

(21) Appl. No.: 15/125,772

(22) PCT Filed: Mar. 17, 2015

(86) PCT No.: PCT/JP2015/057803
§ 371 (c)(1),
(2) Date: Sep. 13, 2016

(87) PCT Pub. No.: WO2015/151784
PCT Pub. Date: Oct. 8, 2015

(65) Prior Publication Data
US 2017/0014970 A1   Jan. 19, 2017

(30) Foreign Application Priority Data
Mar. 31, 2014  (JP) .................................. 2014-072366

(51) Int. Cl.
| | |
|---|---|
| B24B 37/24 | (2012.01) |
| B24D 3/32 | (2006.01) |
| B24D 18/00 | (2006.01) |
| C08G 18/10 | (2006.01) |
| B24D 11/00 | (2006.01) |
| H01L 21/02 | (2006.01) |
| C08G 18/48 | (2006.01) |
| C08G 18/76 | (2006.01) |
| C08G 18/12 | (2006.01) |
| C08G 18/32 | (2006.01) |
| C08G 18/08 | (2006.01) |
| C08G 18/18 | (2006.01) |
| C08J 9/00 | (2006.01) |
| C08G 101/00 | (2006.01) |

(52) U.S. Cl.
CPC ................ *B24B 37/24* (2013.01); *B24D 3/32* (2013.01); *B24D 11/003* (2013.01); *B24D 18/0009* (2013.01); *C08G 18/10* (2013.01); *C08G 18/12* (2013.01); *C08G 18/14* (2013.01); *C08G 18/1808* (2013.01); *C08G 18/3243* (2013.01); *C08G 18/4804* (2013.01); *C08G 18/4854* (2013.01); *C08G 18/7621* (2013.01); *C08J 9/00* (2013.01); *H01L 21/02024* (2013.01); *C08G 2101/0083* (2013.01); *C08J 2205/05* (2013.01); *C08J 2205/052* (2013.01); *C08J 2375/08* (2013.01)

(58) Field of Classification Search
CPC ........... B24B 37/22; B24B 37/24; B24D 3/28; B24D 3/32; B24D 11/003; B24D 18/0009; C08G 18/14; C08J 2205/052; C08J 2375/08
See application file for complete search history.

(56) References Cited

U.S. PATENT DOCUMENTS

| | | | | |
|---|---|---|---|---|
| 6,585,574 B1* | 7/2003 | Lombardo | .............. | B24B 37/24 451/285 |
| 7,300,335 B2* | 11/2007 | Tajima | .................... | B24B 37/08 451/41 |
| 8,545,291 B2* | 10/2013 | Itoyama | .................. | B24B 37/24 451/28 |
| 2006/0035573 A1* | 2/2006 | Preston | .................... | B24B 37/24 451/526 |
| 2008/0182492 A1 | 7/2008 | Crkvenac et al. | | |
| 2012/0100783 A1 | 4/2012 | Itoyama et al. | | |
| (Continued) | | | | |

FOREIGN PATENT DOCUMENTS

| | | |
|---|---|---|
| JP | 2011-020234 A | 2/2011 |
| JP | 2011-200946 A | 10/2011 |
| (Continued) | | |

OTHER PUBLICATIONS

Extended Search Report issued by the European Patent Office in corresponding European Patent Application No. 15772399.0 dated Aug. 8, 2017 (8 pages).
International Search Report (PCT/ISA/210) dated May 29, 2015, by the Japanese Patent Office as the International Searching Authority for International Application No. PCT/JP2015/057803.
Written Opinion (PCT/ISA/237) dated May 29, 2015, by the Japanese Patent Office as the International Searching Authority for International Application No. PCT/JP2015/057803.

*Primary Examiner* — Timothy V Eley
(74) *Attorney, Agent, or Firm* — Buchanan, Ingersoll & Rooney PC

(57) ABSTRACT

Provided is a polishing pad which is capable of providing a high flatness to a polishing workpiece and suppressing the formation of scratches, and a method therefor. The polishing pad comprises a foamed urethane sheet on the surface which includes closed cells and open cells and which satisfies the following requirements: (1) an open cell ratio is 20-80 vol % where the total volume of closed cells and open cells is taken as 100 vol %, (2) the ratio [tan δ (wet/dry) ratio] of a loss factor tan δ in a water-absorption state to that in a dry state is 1.3-1.7, the loss factors being measured according to JIS K7244-4 with an initial load of 20 g at a measuring frequency of 1 Hz at a temperature of 26° C. in a tensile mode over a strain range from 0.01 to 0.1%, and (3) the Shore DO hardness according to ASTM D2240 is 60-80.

11 Claims, No Drawings

(56) References Cited

U.S. PATENT DOCUMENTS

2013/0012106 A1    1/2013   Kazuno
2013/0012108 A1    1/2013   Li et al.

FOREIGN PATENT DOCUMENTS

JP    2012-000714 A    1/2012
JP    2013-515379 A    5/2013

* cited by examiner

POLISHING PAD AND PROCESS FOR PRODUCING SAME

TECHNICAL FIELD

The present invention relates to a polishing pad capable of providing a high flatness to a polishing workpiece, and also capable of suppressing the formation of scratches [for example, a polishing pad for chemical mechanical polishing (CMP)] and a method for producing the polishing pad.

BACKGROUND ART

Substrates made of various hard and brittle materials such as silicon wafers and glass panels are subjected to a polishing process using loose abrasive grains to achieve a high degree of flatness and a low surface roughness so as to obtain two surfaces completely in parallel with each other and to allow the entire surfaces to be used. Specifically, in a state where a slurry containing abrasive grains is held by cells opened on a polishing surface of a polishing pad, the polishing pad and a substrate are rubbed against each other, and thus the surface of the substrate to be polished is processed into a flat surface with the abrasive grains in the slurry. In the polishing with loose abrasive grains, a tendency is observed in which the temperature of the substrate is raised from moment to moment by the frictional heat during the polishing, and the chemical action of the slurry is activated, so that the polishing rate increases. In addition, local heat generation also tends to occur, which causes unevenness in polishing rate within a surface of a substrate, resulting in a problem of deterioration in the degree of flatness. Especially, wafers for LSI production have been gradually increasing in size to improve the productivity nowadays. Recently, wafers having diameters of 200 mm or more have been commonly used, and even wafers having diameters of 300 mm or more have also been produced. With such an increase in size of wafers, the polishing rate tends to be different between a center portion of a wafer and an outer circumferential portion of the wafer, making it extremely difficult to polish a wafer surface uniformly.

To improve the flatness and the surface roughness of a substrate, various polishing pads have been proposed. For example, Japanese Patent Application Publication No. 2012-714 (Patent Literature 1) discloses a polishing pad in which a polishing layer provided on a surface and configured to be brought into pressure contact with a polishing workpiece is formed of a foamed polyurethane including multiple cells, and in which 90% or more of the multiple cells are cells formed such that the inner spaces of the cells are spatially separated from one another.

However, in the case of a polishing pad substantially consisting of closed cells as described above, portions holding the slurry are limited to only portions opened on the surface, and hence the amount of the slurry held is small, so that a cooling effect cannot be obtained sufficiently by the supplied slurry. Presumably because of this, the polishing temperature distribution is uneven, and the polishing is promoted in portions where the polishing temperature is high, so that the surface to be polished cannot be polished uniformly. This trend becomes more pronounced with increase in polishing time, and the degree of flatness deteriorates with time. Moreover, since clogging with foreign substances such as polishing dust proceeds rapidly in the above-described polishing pad, the amount of the slurry held is further reduced, and the slurry held is localized. This causes such a problem that the resultant substrate has a tapered shape or such a problem that excessive polishing of the outer circumference of the substrate causes the edge roll-off. Even when the foreign substances such as polishing dust are removed by dressing with a dresser, the same problems occur soon after several times of polishing.

In addition, Japanese Patent Application Publication No. 2011-20234 (Patent Literature 2) discloses a polishing pad in which a polishing layer configured to be brought into pressure contact with a polishing workpiece is made of a foam having closed cells and open cells, wherein the closed cell ratio, which is the ratio of the volume of the closed cells relative to the total volume of the cells including the closed cells and the open cells, is 0.3 to 10%.

However, since most of the cells in the above-described polishing pad are connected with each other, the resin easily deforms upon reception of a polishing load. Hence, although the formation of scratches on the polishing workpiece can be suppressed to some degree, the requirement for a higher degree of flatness cannot be satisfied.

CITATION LIST

Patent Literatures

Patent Literature 1: Japanese Patent Application Publication No. 2012-714

Patent Literature 2: Japanese Patent Application Publication No. 2011-20234

SUMMARY OF INVENTION

Technical Problems

Accordingly, an object of the present invention is to provide a polishing pad which is capable of providing a high flatness to a polishing workpiece, and also capable of suppressing the formation of scratches, and a method for producing the polishing pad.

Another object of the present invention is to provide a polishing pad capable of providing a high flatness to both a center portion and an outer circumferential portion of a polishing workpiece, and a method for producing the polishing pad.

Still another object of the present invention is to provide a polishing pad capable of stably providing a high flatness even in repeated polishing, while suppressing change with time, and a method for producing the polishing pad.

Solution to Problems

The present inventors have conducted intensive study to achieve the above-described objects, and consequently have found that a polishing pad comprising a foamed urethane sheet which is provided on a surface thereof and which includes closed cells and open cells, in which (1) the open cell ratio (the volume ratio of the open cells to the total of the closed cells and the open cells), (2) the ratio of a loss factor tan δ in a water-absorption state to a loss factor tan δ in a dry state [hereinafter, this ratio is also referred to as "tan δ (wet/dry) ratio"], and (3) the Shore DO hardness are each adjusted to a specific range and are combined, is not only capable of providing a high flatness to a polishing workpiece, but also capable of reducing the occurrence of scratches. This finding has led to the completion of the present invention.

Specifically, the present invention includes the following modes.

[1] A polishing pad comprising a foamed urethane sheet which is provided on a surface thereof and which includes closed cells and open cells, wherein the foamed urethane sheet satisfies the following requirements (1) to (3):

(1) an open cell ratio is 20 to 80% by volume, the open cell ratio being the volume ratio of the open cells, where the total volume of the closed cells and the open cells is taken as 100% by volume, (2) the ratio [tan δ (wet/dry) ratio] of a loss factor tan δ in a water-absorption state to a loss factor tan δ in a dry state is 1.3 to 1.7, the loss factors being measured according to JIS K7244-4 with an initial load of 20 g at a measuring frequency of 1 Hz at a temperature of 26° C. in a tensile mode over a strain range from 0.01 to 0.1%, and (3) the Shore DO hardness measured according to ASTM D2240 is 60 to 80.

[2] The polishing pad according to [1], wherein the foamed urethane sheet includes the closed cells at a ratio of 15 to 35% by volume, the open cells at a ratio of 30 to 45% by volume, and a resin portion at a ratio of 35 to 45% by volume, provided that the total of the closed cells, the open cells, and the resin portion is taken as 100% by volume.

[3] The polishing pad according to [1] or [2], wherein the average opening diameter on a surface of the foamed urethane sheet is 70 to 90 μm.

[4] A method for producing a polishing pad comprising a foamed urethane sheet which is provided on a surface thereof and which includes closed cells and open cells, the method comprising:

step (a) of pouring a curable composition comprising a urethane prepolymer into a mold, and step (b) of foaming and curing the curable composition in the mold, wherein in the step (b), the curable composition is foamed and cured without closing the mold with an upper lid, or when the curable composition is foamed and cured with the mold being closed with an upper lid in the step (b), the curable composition is poured in the step (a) in such an amount that a foamed and cured product of the curable composition does not come into contact with the upper lid of the mold.

[5] The production method according to [4], wherein the curable composition does not comprise a foam stabilizer.

Note that the open cell ratio as used herein can be examined as follows. Specifically, the air in the open cells is replaced with water by immersing the foamed urethane sheet in water and reducing the pressure. In addition, the term "closed cells" means cells which are surrounded by the resin and are present without being connected to the outside, whereas the term "open cells" means cells other than the closed cells, i.e., cells present while being connected to the outside in such a manner that cells opened on the surface of the foamed urethane sheet and inner cells are three-dimensionally connected to each other.

Advantageous Effects of Invention

The polishing pad of the present invention is capable of providing a high flatness to a polishing workpiece, and also capable of effectively suppressing the formation of scratches. In addition, the polishing pad of the present invention is capable of providing a high flatness to not only a center portion but also an outer circumferential portion of a polishing workpiece. Moreover, the polishing pad of the present invention is capable of providing a high flatness even in repeated polishing, while suppressing the change with time.

DESCRIPTION OF EMBODIMENTS

<Polishing Pad>

A polishing pad of the present invention comprises a foamed urethane sheet which is provided on a surface thereof and which includes closed cells and open cells. The foamed urethane sheet satisfies all of the following requirements (1) to (3):

(1) an open cell ratio is 20 to 80% by volume, the open cell ratio being the volume ratio of the open cells, where the total volume of the closed cells and the open cells is taken as 100% by volume, (2) the ratio [tan δ (wet/dry) ratio] of a loss factor tan δ in a water-absorption state to a loss factor tan δ in a dry state is 1.3 to 1.7, the loss factors being measured according to JIS K7244-4 with an initial load of 20 g at a measuring frequency of 1 Hz at a temperature of 26° C. in a tensile mode over a strain range from 0.01 to 0.1%, and (3) the Shore DO hardness measured according to ASTM D2240 is 60 to 80.

Regarding the requirement (1), the open cell ratio (the volume ratio of the open cells, where the total volume of the closed cells and the open cells is taken as 100% by volume) is preferably 30 to 75% by volume (for example, 40 to 75% by volume), and further preferably 50 to 70% by volume (for example, 55 to 70% by volume). When the open cell ratio (the volume ratio of the open cells to all the cells) is within the above-described range, it is possible to persistently provide high flatness to polishing workpieces. Specifically, the deformation of the polishing pad is suppressed by the resistance of the pressure inside the closed cells, so that the deterioration in flatness can be suppressed all over the surface of the polishing workpiece. In addition, a slurry can be sufficiently held by the open cells connected with each other in many directions in the polishing pad, so that flatness can be formed persistently all over the surface.

The volume ratio of the open cells to the total of the closed cells and the open cells can be calculated based on, for example, the formula: $100 \times [(W_2 - W_1)/(V_b - V_L)]$, where $W_1$ represents the dry mass (g) of the foamed urethane sheet, $W_2$ represents the mass (g) of the foamed urethane sheet after water absorption, $V_b$ represents the volume (cm$^3$) of the foamed urethane sheet, and $V_t$ represents the volume (cm$^3$) of the resin portion, which is a value obtained by dividing $W_1$ by the true density (1.2 g/cm$^3$) of urethane.

The foamed urethane sheet includes open cells, closed cells, and a resin portion. The volume ratio of the open cells is, for example, 15 to 55% by volume, preferably 20 to 50% by volume, and further preferably 25 to 45% by volume (for example, 30 to 45% by volume), where the volume of the foamed urethane sheet is taken as 100% by volume. If the volume ratio of the open cells to the foamed urethane sheet is excessively high, the rigidity decreases, which may cause deterioration in flatness. Meanwhile, if the volume ratio of the open cells to the foamed urethane sheet is excessively low, the amount of the slurry entering and exiting cells inside the polishing surface decreases, so that the clogging with foreign substances such as polishing dust becomes more likely to occur, and the amount of the slurry held decreases during repeated polishing, which may cause deterioration in flatness.

The volume ratio of the closed cells is, for example, 5 to 40% by volume, preferably 10 to 38% by volume, and further preferably 15 to 35% by volume, where the volume of the foamed urethane sheet is taken as 100% by volume. In addition, the volume ratio of the resin portion is, for example, 20 to 60% by volume, preferably 30 to 50% by volume, and further preferably 35 to 45% by volume, where the volume of the foamed urethane sheet is taken as 100% by volume.

A preferred foamed urethane sheet includes the closed cells at a ratio of 15 to 35% by volume, the open cells at a ratio of 30 to 45% by volume, and the resin portion at a ratio of 35 to 45% by volume, provided that the total volume of the open cells, the closed cells, and the resin portion is taken as 100% by volume.

When each of the volume ratios of the open cells, the closed cells, and the resin portion is within the above-described range in the foamed urethane sheet, the polishing temperature distribution can be kept constant, even when the polishing pad is slid with respect to a polishing workpiece, presumably because the slurry which is held in the cells and which is contributing to polishing/which has contributed to polishing is efficiently exchanged with the freshly supplied slurry. As a result, the stability of the polishing rate within the surface of the polishing workpiece and the stability of the polishing rate over time can be increased, and also the polished surface can be highly flat.

The volume ratio of the open cells in the foamed urethane sheet can be calculated based on, for example, the formula: $100 \times [(W_2-W_1)/V_b]$, and the volume ratio of the closed cells in the foamed urethane sheet can be calculated based on, for example, the formula: $100 \times \{[(V_b-V_r)-(W_2-W_1)]/V_b\}$. The volume ratio of the resin portion in the foamed urethane sheet can be calculated based on the formula: $100 \times (V_r/V_b)$. The symbols in these formulae have the same meaning as described above.

Regarding the requirement (2), tan δ is the ratio (E"/E') of the loss elastic modulus E" to the storage elastic modulus E'. A small tan δ means that a restoring property (elasticity) against a mechanical deformation is strong, whereas a large tan δ means that a property (viscosity) of remaining deformed upon a mechanical deformation is strong. The tan δ (wet/dry) ratio is preferably 1.35 to 1.7, and further preferably 1.4 to 1.7. If the tan δ (wet/dry) ratio is excessively small, the foamed urethane sheet comes into hard contact with a polishing workpiece, so that scratches are more likely to be formed. Meanwhile, if the tan δ (wet/dry) ratio is excessively high, abrasive grains in the slurry greatly subside into the polishing pad to cause decrease in rate, or clogging occurs more rapidly, so that polishing characteristics may be deteriorated. Accordingly, when the tan δ (wet/dry) ratio is within the above-described range, the elasticity is reduced only on the polishing surface exposed to the slurry (hangnail-like protrusions and polishing aggregations, which may cause scratches on a polishing workpiece, may be present on the surface), so that the formation of scratches on the polishing workpiece can be suppressed, while the hardness of the polishing pad as a whole is kept. In addition, it is also possible to improve the polishing characteristics (the flatness in a center portion and an outer circumferential portion of a polishing workpiece) by improving the retentivity of abrasive grains.

The ratio [E'(wet/dry) ratio] of the storage elastic modulus E' in a water-absorption state to the storage elastic modulus E' in a dry state is, for example, 0.65 to 0.85, and preferably 0.7 to 0.8. In addition, the ratio [E"(wet/dry) ratio] of the loss elastic modulus E" in a water-absorption state to the loss elastic modulus E" in a dry state is, for example, 0.8 to 1.2, and preferably 0.9 to 1.1.

Regarding the requirement (3), the Shore DO hardness is measured under the same pressure application as that for the Shore D hardness, but the shape of the indenter is different. The shape of the indenter for the Shore D hardness is formed of a pointed edge, whereas the shape of the indenter for the Shore DO hardness is a semi-spherical shape. The surface pressure is different between the Shore DO hardness and the Shore D hardness, and the Shore D hardness is used for harder materials. Since the structure of the indenter tool and the corrected spring force scale have influences on the measurement, no simple relationship is present among the measurement results obtained by durometers of different types. In the case of the foam of the present application having openings and continuous cells, the hardness of the material can be read with a high sensitivity, when the hardness is measured by using the Shore DO hardness for which the contact area is larger than for the Shore D durometer. The Shore DO hardness is preferably 65 to 80 (for example, 66 to 75), from the viewpoint of achieving both a high degree of flatness of polishing workpieces and a low incidence of scratches. When the Shore DO hardness is excessively low, the polishing pad greatly depresses, so that it is difficult to provide a high flatness to the polishing workpiece. Meanwhile, if the Shore DO hardness is excessively high, the polishing pad is so hard that scratches may be formed on the polishing workpiece.

The average opening diameter on a surface (for example, a polishing surface) of the foamed urethane sheet varies depending on the exchangeability between the slurry being held and the slurry involved in the polishing and the like, and is, for example, 50 to 120 μm, preferably 60 to 110 μm, and further preferably 80 to 100 μm. Note that the average opening diameter can be determined by a commonly used method, for example, by using a micrograph of the surface of the foamed urethane sheet, and calculating the average value of equivalent circle diameters from the number of cells [cells having opening diameters of a predetermined threshold (for example, 10 μm) or larger] present in the photograph and the opening area.

The density of the foamed urethane sheet is, generally, in a range lower than the true density of urethane, and is, for example, 0.3 to 0.9 g/cm$^3$, and preferably 0.4 to 0.8 g/cm$^3$.

The thickness of the foamed urethane sheet is not particularly limited, and is, for example, about 0.5 to 2 mm, preferably about 0.8 to 1.8 mm, and further preferably about 1 to 1.5 mm, from the viewpoint of the strength.

Note that the polishing pad is not particularly limited, as long as the foamed urethane sheet is provided on the surface. The polishing pad may be a foamed urethane sheet alone, or may comprise layers other than the foamed urethane sheet. For example, the polishing pad may be a laminate in which a substrate layer and the foamed urethane sheet are stacked on each other. Examples of the substrate layer include plastic films (for example, films of thermoplastic resins such as acrylic resin, vinylic resin, olefin-based resin, styrene-based resin, polyester-based resin, polycarbonate-based resin, polyamide-based resin, and the like), nonwoven fabrics, and the like.

<Method for Producing Polishing Pad>

The polishing pad of the present invention can be produced by a dry forming method, for example, a method comprising: step (a) of pouring a curable composition comprising a urethane prepolymer into a mold, and step (b) of curing the curable composition in the mold.

The curable composition used in the step (a) comprises a urethane prepolymer. The urethane prepolymer is a reaction product between a polyisocyanate compound and a polyol compound.

The polyisocyanate compound is not particularly limited, as long as two or more isocyanate groups are present in the molecule. Examples of the polyisocyanate compound include aliphatic polyisocyanates [for example, tetramethylene diisocyanate, hexamethylene diisocyanate, trimethylhexamethylene diisocyanate, lysine diisocyanate, hexamethylene triisocyanate, and undecane triisocyanate], alicyclic polyisocyanates [for example, cyclohexane diisocyanate, isophorone diisocyanate, methylenebis(cyclohexyl isocyanate), hydrogenated xylylene diisocyanate, hydrogenated bis(isocyanatophenyl)methane, norbornane diisocyanate, and trimethylisocyanatocyclohexane], aromatic polyisocyanates [for example, phenylene diisocyanate, naphthylene diisocyanate, xylylene diisocyanate, tetramethylxylylene diisocyanate, diphenylmethane diisocyanate, tolylene diisocyanate, toluidine diisocyanate, diphenyl ether diisocyanate, bis (isocyanatophenyl) propane, triisocyanatomethylbenzene, and triphenylmethane triisocyanate], and derivatives thereof (for example, dimers, trimer, biurets, and allophanates). One of these polyisocyanate compounds can be used alone, or two or more thereof can be used in combination. Of these polyisocyanate compounds, diisocyanate compounds are preferable, and aromatic diisocyanates such as tolylene diisocyanate are particularly preferable.

The polyol compound is not particularly limited, as long as two or more hydroxyl groups are present in the molecule. Examples of the polyol compound include aliphatic polyols [for example, alkanediols such as ethylene glycol, propylene glycol, and butylene glycol; and alkane polyols such as glycerin, trimethylolpropane, and pentaerythritol], alicyclic polyols [for example, cycloalkanediols such as cyclohexanediol; and hydrogenated bisphenols such as hydrogenated bisphenol A], aromatic polyols [for example, bisphenols such as bisphenol A; and xylylene glycol], polyether polyols [for example, polyalkylene glycols such as polyethylene glycol, polypropylene glycol, and polytetramethylene glycol], polyester polyols [for example, a reaction product between ethylene glycol and adipic acid, and a reaction product between butylene glycol and adipic acid], polycarbonate polyols, polyacrylic polyols, and the like. One of these polyol compounds can be used alone, or two or more thereof can be used in combination. Of these polyol compounds, polyether polyols are preferable. Of the polyether polyols, polyalkylene glycols (for example, poly $C_{2-10}$ alkylene glycols such as polyethylene glycol and polytetramethylene glycol) are preferable. Especially, a combination of a polyethylene glycol (for example, diethylene glycol) with a polytetramethylene glycol (for example, a polytetramethylene glycol having a number average molecular weight of 1000 or less, and preferably a polytetramethylene glycol having a number average molecular weight of 500 to 800) is preferable.

The isocyanate content in the urethane prepolymer is not particularly limited, and is preferably 5 to 10% by mass, where the urethane prepolymer is taken as 100% by mass.

The curable composition may comprise commonly used additives, for example, a curing agent, a foaming agent, a catalyst, and the like. The curing agent is not particularly limited, as long as the curing agent has an active hydrogen group. In addition to the above-described polyol compounds, examples of the curing agent include polyamine compounds, for example, aliphatic polyamines [for example, alkylene diamines such as ethylenediamine, propylenediamine, hexamethylenediamine, hydroxyethylethylenediamine, and hydroxyethylpropylenediamine]; alicyclic polyamines [for example, isophoronediamine and dicyclohexylmethane-4,4'-diamine], aromatic polyamines [for example, 3,3'-dichloro-4,4'-diaminodiphenylmethane (MOCA)], and the like. One of these curing agents can be used alone, or two or more thereof can be used in combination. Of these curing agents, diamine compounds are preferable. Especially, aromatic diamine compounds such as MOCA are preferable. The amount of the curing agent is, for example, 10 to 40 parts by mass, preferably 15 to 35 parts by mass, and further preferably 20 to 30 parts by mass relative to 100 parts by mass of the urethane prepolymer. Note that the equivalence ratio (R value) of the active hydrogen groups (such as amino groups) of the curing agent relative to the isocyanate groups of the urethane prepolymer is, for example, 0.6 to 1, and preferably 0.7 to 0.9.

Foaming agents can be classified into volatile foaming agents (physically foaming agents) and reactive foaming agent (chemically foaming agents). Examples of volatile foaming agents include hydrocarbons, for example, butane, propane, pentane, hexane, and cyclopentane, and the like. Examples of reactive foaming agents include water, lower carboxylic acids, and the like. One of these foaming agents can be used alone, or two or more thereof can be used in combination. Of these foaming agents, reactive foaming agents are preferable, and water is particularly preferable. The amount of the foaming agent used can be selected, as appropriate, according to the degree of foaming, and is, for example, 0.001 to 1 parts by mass, preferably 0.01 to 0.5 parts by mass, and further preferably 0.1 to 0.3 parts by mass relative to 100 parts by mass of the urethane prepolymer.

The catalyst may be a commonly used component, and, examples thereof include amine compounds (tertiary amines such as triethylenediamine; alcohol amines; ether amines such as bis(2-dimethylaminoethyl) ether; and the like), acetic acid salts (potassium acetate and the like), tin compounds (such as dibutyltin dilaurate), and trialkylphosphine compounds (such as triethylphosphine). One of these catalysts can be used alone, or two or more thereof can be used in combination. Of these catalysts, amine compounds are preferable, and ether amines such as bis(2-dimethylaminoethyl) ether are especially preferable. The amount of the catalyst is not particularly limited, and is, for example, 0.001 to 1 parts by mass, and preferably 0.01 to 0.5 parts by mass relative to 100 parts by mass of the urethane prepolymer.

In the present invention, it is preferable that the curable composition contain no foam stabilizer (silicone-based surfactant or the like). Since the curable composition contains no foam stabilizer, it is possible to make a predetermined foamed structure easier to form (especially, it is possible to make the ratio of open cells easier to increase).

In addition, in the present invention, the tan δ (wet/dry) ratio and the Shore DO hardness can be controlled by adjusting, as appropriate, the constituents of the urethane resin and the types and the blending amounts of the additives (especially, the foaming agent and the catalyst) in the curable composition, considering the balance between the foaming reaction and the resin formation reaction.

In the present invention, when the curable composition is foamed and cured without closing the mold with an upper lid in step (b), or when the curable composition is foamed and cured with the mold being closed with an upper lid in step (b), the curable composition is preferably poured in step (a) in such an amount that a foamed and cured product of the curable composition does not come into contact with the upper lid of the mold. Such a feature (free foaming) makes it possible to form the predetermined foamed structure stably, presumably because the cells stably grow without coming into contact with the upper lid of the mold, even when the thickness increases because of the foaming.

In step (a), when the mold is not closed with an upper lid, the amount of the curable composition poured is not particularly limited. Meanwhile, when the mold is closed with an upper lid, the amount of the curable composition poured is preferably selected from such amounts that a foamed and cured product of the curable composition does not come into contact with the upper lid of the mold. For example, when the thickness of the mold is taken as 100, the curable composition may be poured to a height of 95 or less, and preferably 90 of less (for example, 70 to 90) before the foaming and curing, so that the height can be less than 100 after the foaming and curing.

In the step (b), the curable composition may be foamed and cured with the mold being closed with an upper lid or with the mold not being closed with an upper lid but being open. The curable composition is preferably foamed and cured with the mold being closed with an upper lid, from the viewpoint of suppressing the creation of unevenness in temperature in the mold to improve the stability of the foaming.

The foaming and curing temperature can be selected, as appropriate, according to the type of the foaming agent and the degree of the foaming, and is, for example, 60 to 100° C., and preferably 70 to 90° C. The foaming and curing time is, for example, 10 minutes to 1 hour, and preferably 15 minutes to 45 minutes.

The method for producing a polishing pad may further comprise step (c) of subjecting the foamed and cured product (primary cured product) obtained in the step (b) to curing (secondary curing). The secondary curing is generally performed in a state where the primary cured product is released from the mold. The secondary curing temperature is, generally, in a range higher than the primary curing temperature, and is, for example, 90 to 150° C., and preferably 100 to 140° C. The secondary curing time is, for example, 1 to 15 hours, and preferably 5 to 10 hours.

EXAMPLES

Hereinafter, the present invention will be described in further detail based on Examples; however, the present invention is not limited to these examples.

In the following description, "parts" means "parts by mass," unless otherwise noted. In addition, each abbreviation is used in the commonly used sense. Representative abbreviations and their meaning are as follows.
2,4-TDI: 2,4-tolylene diisocyanate
PTMG: polytetramethylene glycol
MOCA: 3,3'-dichloro-4,4'-diaminodiphenylmethane
PPG: polypropylene glycol
[Methods for Evaluating Polishing Pads]

Polishing pads of Examples and Comparative Examples were evaluated for the volume ratio among the closed cells, the open cells, and the resin portion, the open cell ratio, the tan δ (wet/dry) ratio, the Shore DO hardness, the average opening diameter, and polishing characteristics (flatness and scratch prevention) by the following methods.
(Volume Ratio of Open Cells)

Each sample was cut out in a size of 3 cm×3 cm, and the dry mass (initial mass) $W_1$ was measured. To a 1 L beaker, 300 mL of water at 20±2° C. was added, and the sample to which a clip was attached was placed in the beaker, which was then covered with a bell jar. A magnetic stirrer was placed under the bell jar, and the sample was immersed by magnetic force. Next, the sample was degassed and water was allowed to enter the sample by reducing the pressure to a negative pressure with an aspirator for 20 minutes in the bell jar. The sample from which the clip was detached was wrapped with KIMTOWELS, and water on the surface was wiped away. Then, the mass $W_2$ after water absorption was measured. The water absorption amount $W_3$ (open cell volume) taken up by the sample was calculated by the formula: $W_2-W_1$. The volume ratio of the open cells was calculated based on the percentage $[100\times(W_3/V_b)]$ of the water absorption amount $W_3$ to the volume $V_b$ (3 cm×3 cm×thickness of sample) of the sample.
(Volume Ratio of Resin Portion)

The volume $V_t$ of the resin portion was calculated by dividing the dry mass $W_1$ of the sample by the true specific gravity (1.2 g/cm$^3$) of urethane. The volume ratio of the resin portion was calculated based on the percentage $[100\times(V_t/V_b)]$ of the volume $V_t$ of the resin portion to the volume $V_b$ of the sample.
(Volume Ratio of Closed Cells)

The foamed space volume (the total volume of the closed cells and the open cells) V was calculated by the formula: $V_b-V_t$. Next, the closed cell volume was calculated by the formula: $V-W_3$. The volume ratio of the closed cells was calculated based on the percentage $[100\times((V-W_3)/V_b)]$ of the closed cell volume to the volume $V_b$ of the sample.
(Open Cell Ratio)

The open cell ratio was calculated based on the percentage of the volume ratio of the open cells to the total of the volume ratio of the closed cells and the volume ratio of the open cells.
(Tan δ (Wet/Dry) Ratio)

Each sample used for the measurement of tan δ was one obtained by cutting a 5×50 mm piece from a produced polyurethane foam with a thickness of 1.3 mm. Note that the tan δ in a water-absorption state was measured after the sample was impregnated with water by the method described in the section "Volume Ratio of Open Cells."

For the tan δ in each of the water-absorption state and in the dry state, the storage elastic modulus (E') and the loss elastic modulus (E") were measured according to JIS K7244-4 with an initial load of 20 g at a measuring frequency of 1 Hz at a temperature of 26° C. in a tensile mode over a strain range from 0.01 to 0.1%, and then the tan δ was calculated by the formula: E"/E'.
(Shore DO Hardness)

Multiple samples cut out to have a size of 10 cm×10 cm were stacked on each other to a thickness of 4.5 mm or more, and the shore DO hardness was measured with a DO-type durometer according to ASTM D2240.
(Average Opening Cells)

An area of approximately 1.3 mm square on a surface of a pad was observed under a microscope (VH-6300 manufactured by KEYENCE) with 175 times magnification. The obtained image was subjected to a binarization process using image processing software (Image Analyzer V20 LAB Ver. 1.3 manufactured by Nikon Corporation), and the number of cells was counted. In addition, equivalent circle diameters were measured from the areas of cells, and the average value thereof was calculated. Note that the cutoff value (lower limit) of the opening diameters was set to 10 μm to eliminate noise components.
(Flatness)

Silicon wafers were polished with polishing pads of Examples and Comparative Examples under the polishing conditions shown below. Then, the change in wafer shape with the increase of polishing batches was compared among the polishing pads of Examples and Comparative Examples.

Polished wafers: silicon wafers with a diameter of 300 mm

Polishing machine: a double sided polishing machine manufactured by FUJIKOSHI MACHINERY CORP.

Polishing liquid (slurry): a pH 10.5 alkaline solution containing colloidal silica and manufactured by Fujimi Incorporated Polishing pressure: 15 kPa Number of revolutions of polishing head and polishing platens: 30 rpm Specifically, polishing pads were attached to upper and lower platens of the polishing machine, and 10 batches of a polishing process in which five silicon single crystal wafers with a diameter of 300 mm were polished per batch were performed with a polishing time per batch being 30 minutes. Then, the degree of flatness was measured. For the measurement of the degree of flatness, the GBIR was evaluated by using a flatness measuring instruments (Nanometoro 300TT-A manufactured by KURODA Precision Industries Ltd.). The GBIR (global backsurface-referenced ideal plane/range) refers to the range of positive and negative deviations from an ideal plane over the entire front surface of a semiconductor wafer with reference to back surface, and is used to evaluate the flatness of the entire wafer surface defined while excluding circumferential portions.

In addition, one silicon wafer was selected from each batch of the double-side polished silicon wafers, and evaluated in terms of SFQRmax (site front least squares range) of an outer circumferential portion of the wafer. SFQR is a numeric value indicating the degree of roll-off of a wafer. The results of Examples and Comparative Examples were evaluated by relative comparison with reference to the result of Example 1 as follows. Specifically, when an 10% or more improvement over Example 1 was observed, the result was evaluated as Excellent, when an improvement over Example 1 was observed in a range of less than 10%, the result was evaluated as Good, when a deterioration from Example 1 was observed in a range of less than 10%, the result was evaluated as Fair, and when a 10% or more deteriorate from Example 1 was observed, the result was evaluated as Poor.

(Scratch Prevention)

Scratches which were present on the surfaces of the polished silicon wafers and which had sizes larger than 0.16 µm were observed with a wafer surface inspection device (Surfscan SP1DLS manufactured by KLA-Tencor Corporation), and the presence or absence of scratches on the surfaces of the substrates was compared and evaluated.

Preparation of Polishing Pads of Examples and Comparative Examples

Example 1

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3 parts of water and 1 part of a catalyst (TOYOCAT-ET manufactured by Tosoh Corporation) were added to 50 parts of PPG having a number average molecular weight of approximately 3000, followed by stirring and mixing. A mixture liquid obtained by mixing at a mass ratio of first component/second component/third component=100/26.2/2.95 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 2

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3 parts of water and 1 part of a catalyst (TOYOCAT-ET manufactured by Tosoh Corporation) were added to 50 parts of PPG having a number average molecular weight of approximately 3000, followed by stirring and mixing. A mixture liquid obtained by mixing at a mass ratio of first component/second component/third component=100/26.2/3.00 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 3

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3.9 parts of water and 0.5 parts of a catalyst (TOYOCAT-ET manufactured by Tosoh Corporation) were added to 50 parts of PPG having a number average molecular weight of approximately 3000, followed by stirring and mixing. A mixture liquid obtained by mixing at a mass ratio of first component/second component/third component=100/24.9/2.80 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 4

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3 parts of water and 1 part of a catalyst (TOYOCAT-ET manufactured by Tosoh Corporation) were added to 50 parts of PPG having a number average molecular weight of approximately 3000, followed by stirring and mixing. A mixture liquid obtained by mixing at a mass ratio of first component/second component/third component=100/26.2/2.80 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 5

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3 parts of water and 1 part of a catalyst (TOYOCAT-ET manufactured by Tosoh Corporation) were added to 50 parts of PPG having a number average molecular weight of approximately 3000, followed by stirring and mixing. A mixture liquid obtained by mixing at a mass ratio of first component/second component/third component=100/26.2/2.80 was poured into a frame (890 mm×890 mm×50 mm) to a height of 45 mm, and subjected to primary curing at 80° C. for 30 minutes, with an upper portion lid being open. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 6

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 2 parts of water and 1.5 parts of a catalyst (TOYOCAT-ET manufactured by Tosoh Corporation) were added to 50 parts of PTMG having a number average molecular weight of approximately 2000, followed by stirring and mixing. A mixture liquid obtained by mixing at a mass ratio of first component/second component/third component=100/26.2/3.05 was poured into a frame (890 mm×890 mm×50 mm) to a height of 45 mm, and subjected to primary curing at 80° C. for 30 minutes, with an upper portion lid being open. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 7

As a prepolymer serving as a first component, a terminal isocyanate group-containing urethane prepolymer was used which was obtained by a reaction of 2,4-TDI, PTMG having a number average molecular weight of approximately 1000, PTMG having a number average molecular weight of approximately 650, and diethylene glycol, and which had an isocyanate content of 9.2%. This prepolymer was heated to 40° C., and degassed under reduced pressure. MOCA serving as a second component was melted at 120° C. As for a dispersion serving as a third component, 2 parts of water and 1.5 parts of a catalyst (TOYOCAT-ET manufactured by Tosoh Corporation) were added to 50 parts of PTMG having a number average molecular weight of approximately 2000, followed by stirring and mixing. A mixture liquid obtained by mixing at a mass ratio of first component/second component/third component=100/21.8/3.10 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 8

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3 parts of water, 1 part of a catalyst (TOYOCAT-ET manufactured by Tosoh Corporation), and 1 part of a foam stabilizer (silicon-based surfactant SH193 manufactured by Dow Corning Toray Co., Ltd.) were added to 50 parts of PPG having a number average molecular weight of approximately 3000, followed by stirring and mixing. A mixture liquid obtained by mixing at a mass ratio of first component/second component/third component=100/25.9/3.00 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Example 9

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.0%. This prepolymer was heated to 35° C., and degassed under reduced pressure. MOCA serving as a second component was melted at 120° C. As for a dispersion serving as a third component, 3 parts of water and 1 part of a catalyst (TOYOCAT-ET manufactured by Tosoh Corporation) were added to 50 parts of PPG having a number average molecular weight of approximately 3000, followed by stirring and mixing. A mixture liquid obtained by mixing at a mass ratio of first component/second component/third component=100/25.8/3.00 was poured into a frame (890 mm×890 mm×50 mm) to a height of 50 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Comparative Example 1

As a prepolymer serving as a first component, a terminal isocyanate group-containing urethane prepolymer was used which was obtained by a reaction of 2,4-TDI, PTMG having a number average molecular weight of approximately 1000, PTMG having a number average molecular weight of approximately 650, and diethylene glycol, and which had an isocyanate content of 9.2%. This prepolymer was heated to 40° C., and degassed under reduced pressure. MOCA serving as a second component was melted at 120° C. A dispersion serving as a third component was obtained by formulating at a mass ratio of PTMG having a number average molecular weight of approximately 2000/water/catalyst (TOYOCAT-ET manufactured by Tosoh Corporation)=50/2/1.5. A mixture liquid obtained by mixing the first component, the second component, and the third component at a mass ratio of first component/second component/third component=100/21.9/3.1 was poured into a frame (890 mm×890 mm×50 mm) to a height of 50 mm, and subjected to primary curing at 80° C. for 30 minutes with an upper portion lid being closed. Then, the formed polyurethane foam was taken out of the frame, and subjected to secondary curing at 120° C. for 8 hours. This foam was sliced to a thickness of 1.3 mm to prepare foamed urethane sheets. Thus, polishing pads were produced.

Comparative Example 2

TO 100 parts of a terminal isocyanate group-containing urethane prepolymer which was obtained by a reaction of 2,4-TDI, PTMG having a number average molecular weight of approximately 1000, and diethylene glycol, and which had an isocyanate content of 10.0% as a prepolymer serving as a first component, 2.1 parts of spherical fine particles (acrylonitrile-vinylidene chloride copolymer shells containing isobutane) were added, followed by stirring and mixing. Then, this mixture was heated to 80° C., and degassed under reduced pressure. MOCA serving as a second component was melted at 120° C. A mixture liquid obtained by mixing at a mass ratio of first component/second component=100/26 was poured into a frame (890 mm×890 mm×50 mm) to a height of 50 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

Comparative Example 3

As a prepolymer serving as a first component, a terminal isocyanate group-containing urethane prepolymer was used which was obtained by a reaction of 2,4-TDI, PTMG having a number average molecular weight of approximately 650, and diethylene glycol, and which had an isocyanate content of 10.6%. This prepolymer was heated to 35° C., and degassed under reduced pressure. MOCA serving as a second component was melted at 120° C. As for a dispersion serving as a third component, 3 parts of water and 1 part of a catalyst (TOYOCAT-ET manufactured by Tosoh Corporation) were added to 50 parts of PPG having a number average molecular weight of approximately 3000, followed by stirring and mixing. Then, the mixture was degassed under reduced pressure. A mixture liquid obtained by mixing at a mass ratio of first component/second component/third component=100/26.7/2.80 was poured into a frame (890 mm×890 mm×50 mm) to a height of 45 mm, and subjected to primary curing at 80° C. for 30 minutes with an upper portion lid being closed. Then, the formed polyurethane resin foam was taken out of the frame, and subjected to secondary curing at 120° C. for 8 hours. This foam was sliced to a thickness of 1.3 mm to prepare foamed urethane sheets. Thus, polishing pads were obtained.

The results of the foamed urethane sheets obtained in Examples and Comparative Examples are shown in Tables 1 and 2 below.

TABLE 1

|  | Closed cells (% by volume) | Open cells (% by volume) | Resin portion (% by volume) | Open cell ratio (%) | tanδ (dry/wet) ratio | Shore DO hardness | Average opening diameter (μm) |
| --- | --- | --- | --- | --- | --- | --- | --- |
| Example 1 | 19.78 | 40.91 | 39.30 | 67.4 | 1.47 | 69 | 92 |
| Example 2 | 21.58 | 37.39 | 41.03 | 63.4 | 1.55 | 67 | 92 |
| Example 3 | 21.72 | 37.39 | 40.90 | 63.3 | 1.69 | 69 | 88 |
| Example 4 | 21.78 | 37.03 | 41.19 | 63.0 | 1.61 | 69 | 87 |
| Example 5 | 25.97 | 33.82 | 40.21 | 56.6 | 1.5 | 68 | 86 |
| Example 6 | 43.37 | 13.06 | 43.57 | 23.1 | 1.38 | 71 | 93 |
| Example 7 | 21.65 | 34.77 | 43.58 | 61.6 | 1.33 | 61 | 91 |
| Example 8 | 41.92 | 20.57 | 37.51 | 32.9 | 1.56 | 68 | 83 |
| Example 9 | 39.32 | 23.08 | 37.61 | 37.0 | 1.56 | 68 | 91 |
| Com. Ex. 1 | 25.39 | 32.66 | 41.95 | 56.3 | 1.25 | 63 | 94 |
| Com. Ex. 2 | 31.83 | 0.00 | 68.17 | 0.0 | 1.30 | 81 | 22 |
| Com. Ex. 3 | 38.81 | 22.71 | 38.48 | 36.9 | 1.89 | 74 | 76 |

TABLE 2

| | Example | | | | | | | | | Comparative Example | | |
|---|---|---|---|---|---|---|---|---|---|---|---|---|
| | 1 | 2 | 3 | 4 | 5 | 6 | 7 | 8 | 9 | 1 | 2 | 3 |
| GBIR Max | Good | Good | Excellent | Excellent | Good | Good | Fair | Good | Good | Fair | Excellent | Excellent |
| Change in GBIR with time | Unchanged | Unchanged | Unchanged | Unchanged | Unchanged | Changed | Unchanged | Changed | Changed | Unchanged | Changed | Changed |
| SFQR Max | Good | Good | Excellent | Good | Good | Good | Poor | Good | Good | Poor | Excellent | Good |
| Scratches | Absent | Absent | Absent | Absent | Absent | Absent | Absent | Absent | Absent | Present | Present | Present |

From the results in Table 2, it can be seen that the polishing pads of Examples 1 to 9 are capable of more effectively suppressing the formation of scratches on wafers than the polishing pads of Comparative Examples 1 to 3, because no scratches were observed in the cases of the polishing pads of Examples 1 to 9. Especially, the GBIR Max of each of the polishing pads of Examples 1 to 6, 8, and 9 was good, and it can be seen that he polishing pads of Examples 1 to 6, 8, and 9 are capable of providing a high flatness in a center portion of a wafer. Moreover, since the GBIR of each of the polishing pads of Examples 1 to 5 and 7 did not change with time, it can be seen that no clogging occurs even in repeated polishing, and the polishing pads of Examples 1 to 5 and 7 are capable of persistently providing a high flatness. Moreover, since the SFQR Max of each of the polishing pads of Examples 1 to 6, 8, and 9 was good, it can be seen that the polishing pads of Examples 1 to 6, 8, and 9 are capable of providing a high flatness also in an outer circumferential portion of a wafer.

INDUSTRIAL APPLICABILITY

The polishing pad of the present invention is capable of providing a high flatness to a polishing workpiece and also capable of suppressing the formation of scratches. For this reason, the polishing pad of the present invention can be used preferably for polishing (especially, primary polishing) of various polishing workpieces, for example, semiconductor wafers [for example, semiconductor wafers (silicon wafers or the like) having diameters of 200 mm or more (preferably 300 mm or more)], and glass [for example, optical lenses, and glass for liquid-crystal displays].

The invention claimed is:

1. A polishing pad provided on a surface thereof with a foamed urethane sheet which includes closed cells and open cells, wherein
the foamed urethane sheet satisfies the following requirements (1) to (3):
(1) a ratio of the open cells relative to the total volume of the closed cells and the open cells included in the foamed urethane sheet is 40 to 75% by volume,
(2) a ratio [tan δ (wet/dry) ratio] of a loss factor tan δ in a water-absorption state to a loss factor tan δ in a dry state is 1.3 to 1.7, the loss factors being measured according to JIS K7244-4 with an initial load of 20 g at a measuring frequency of 1 Hz at a temperature of 26° C. in a tensile mode over a strain range from 0.01 to 0.1%, and
(3) a Shore DO hardness measured according to ASTM D2240 is 60 to 80.

2. The polishing pad according to claim 1, wherein the foamed urethane sheet includes the closed cells at a ratio of 15 to 35% by volume, the open cells at a ratio of 30 to 45% by volume, and a resin portion at a ratio of 35 to 45% by volume, provided that the total of the closed cells, the open cells, and the resin portion is taken as 100% by volume.

3. The polishing pad according to claim 1, wherein an average opening diameter on a surface of the foamed urethane sheet is 70 to 90 μm.

4. A method for producing a polishing pad according to claim 1, the method comprising:
step (a) of pouring a curable composition comprising a urethane prepolymer into a mold; and
step (b) of foaming and curing the curable composition in the mold, wherein
in the step (b), the curable composition is foamed and cured without closing the mold with an upper lid, or
when the curable composition is foamed and cured with the mold being closed with an upper lid in the step (b), the curable composition is poured in the step (a) in such an amount that a foamed and cured product of the curable composition does not come into contact with the upper lid of the mold,
wherein the foamed urethane sheet satisfies the following requirements (1) to (3):
(1) a ratio of the open cells relative to the total volume of the closed cells and the open cells included in the foamed urethane sheet is 40 to 75% by volume,
(2) a ratio [tan δ (wet/dry) ratio] of a loss factor tan δ in a water-absorption state to a loss factor tan δ in a dry state is 1.3 to 1.7, the loss factors being measured according to JIS K7244-4 with an initial load of 20 g at a measuring frequency of 1 Hz at a temperature of 26° C. in a tensile mode over a strain range from 0.01 to 0.1%, and
(3) a Shore DO hardness measured according to ASTM D2240 is 60 to 80.

5. The production method according to claim 4, wherein the curable composition does not comprise a foam stabilizer.

6. The method according to claim 4, wherein the curable composition comprises no silicone-based surfactant.

7. The polishing pad according to claim 1, wherein the foamed urethane sheet comprises no silicone-based surfactant.

8. The polishing pad according to claim 1, wherein the foamed urethane sheet comprises no foam stabilizer.

9. The polishing pad according to claim 1, wherein the ratio [tan δ (wet/dry) ratio] is 1.4 to 1.7.

10. The polishing pad according to claim 1, wherein the ratio of the open cell relative to the total volume of the closed cells and the open cells included in the foamed urethane sheet is 50 to 70% by volume.

11. The polishing pad according to claim 1, wherein
the ratio of the open cell relative to the total volume of the closed cells and the open cells included in the foamed urethane sheet is 50 to 70% by volume, and
the ratio [tan δ (wet/dry) ratio] is 1.4 to 1.7, and
the foamed urethane sheet comprises no foam stabilizer.

\* \* \* \* \*